United States Patent [19]

Giamei

[11] 4,190,094
[45] Feb. 26, 1980

[54] RATE CONTROLLED DIRECTIONAL SOLIDIFICATION METHOD

[75] Inventor: Anthony F. Giamei, Middletown, Conn.

[73] Assignee: United Technologies Corporation, Hartford, Conn.

[21] Appl. No.: 954,386

[22] Filed: Oct. 25, 1978

[51] Int. Cl.² ........................ B22D 27/04; B22D 25/00
[52] U.S. Cl. ........................................ 164/60; 164/125
[58] Field of Search .................. 164/60, 91, 125, 126, 164/127, 128, 348, 154, 338 R, 338 M, 338 H; 148/32; 75/170, 171, 65 ZM

[56] References Cited

U.S. PATENT DOCUMENTS

| | | | |
|---|---|---|---|
| 3,124,452 | 3/1964 | Kraft | 164/128 X |
| 3,677,835 | 7/1972 | Tien et al. | 148/32.5 |
| 3,700,023 | 10/1972 | Giamei et al. | 164/60 |
| 3,763,926 | 10/1973 | Tschinkel et al. | 164/338 R |
| 3,790,303 | 2/1974 | Endress | 416/241 |
| 3,897,815 | 8/1975 | Smashey | 164/127 |
| 3,915,761 | 10/1975 | Tschinkel et al. | 164/127 X |

OTHER PUBLICATIONS

"Computer Application in Directional Solidification Process" by Giamei et al, 3rd International Symposium on Superalloys-AIME, Seven Springs, Pa., 9/76.

"Growth of Composites from the Melt-Part II" by Mollard, et al., Trans. of AIME, vol. 239, 10/67, p. 1534.

Primary Examiner—Robert D. Baldwin
Assistant Examiner—K. Y. Lin
Attorney, Agent, or Firm—Charles G. Nessler

[57] ABSTRACT

An improved method of directional solidification is provided by varying the rate of withdrawal of a casting from the hot zone of a solidification furnace according to the sense of change of the perimeter to area ratio of the casting. The rates are varied to achieve desired microstructure and resultant properties in the casting. Also, the rate of withdrawal is varied according to controlled and predetermined relationships to cause the solidification interface to move through a transition section connecting sections of differing perimeter to area ratios in a manner which produces a desired microstructure in a first, transition, and second sections.

17 Claims, 6 Drawing Figures

RATE CONTROLLED DIRECTIONAL SOLIDIFICATION METHOD

The United States of America Government has rights in this invention pursuant to Contract No. N62269-76-C-0303 awarded by the Navy.

BACKGROUND OF THE INVENTION

This invention relates to an improved method of casting, and more particularly, directional solidification where the rate of withdrawal is purposefully varied, together with articles made by the improved process.

Directional solidification is a process for producing metal articles with aligned structures and resultant advantageous mechanical properties. The apparatus and methods for forming directional solidified articles are well documented in the literature. The most preferred from a commercial standpoint is the withdrawal technique in which a mold, after pouring, is vertically withdrawn from within a furnace hot zone into a cold zone at a rate which causes a solidification interface to move uniformly upward within the casting along its principal stress axis. Past improvements in the withdrawal technique have related to control of the hot zone temperatures, the spatial disposition of the chill plate means, baffling between the hot zone and the cold zone, and increasing the rate of heat loss which occurs in the cold zone. In the past it has been the practice to withdraw castings from the hot zone at a uniform rate, or stationary periods in alternation with a uniform rate as described in Giamei et al, U.S. Pat. No. 3,700,023.

The optimum rate of withdrawal is a function of the configuration of the apparatus, the configuration and composition of the mold, the solidification characteristics of the metal alloy, the microstructure sought in the casting, and economic considerations. One of the most significant relationships is that between the temperature gradient, G, and the solidification rate, R. Generally, it is found with most eutectic superalloys to which directional solidification is applied that the G/R ratio must exceed a characteristic value for each alloy; this critical value is designated $(G/R)^*$. Most commonly, this value is equal to the ratio $\Delta T/D$, where $\Delta T$ represents the alloy melting range and D represents the effective diffusion coefficient of solute atoms in the liquid metal. It follows that, to maximize the permissible solidification rate and thereby increase production and minimize metalmold reaction, it is desirable to increase the temperature gradient G in the molten metal. An advantageous method for doing this is that described in Tschinkel et al U.S. Pat. No. 3,763,926 and Tschinkel et al U.S. Pat. No. 3,915,761, both of the present assignee, where the mold is withdrawn to be immersed in molten metal as it passes into the cold zone; this technique is called Liquid Metal Cooling, or LMC.

Experience has shown that to obtain preferred microstructures it is desirable to maintain the solidification interface as essentially flat, that is, perpendicular to the direction of solidification. The reason for this follows: for a fixed temperature gradient, G, if R is too high or too low the solidification interface will be curved convexly upward and downward, respectively. This non-unidirectional condition will be indicative that growth on a microscopic basis will not be aligned with the principal axis along which the casting is being solidified. Therefore, depending on the practical deviation from unidirectional growth the casting will have deviant crystallographic or grain growth and resultant inferior properties. Furthermore, if a casting is solidified too fast extraneous nucleation may occur ahead of the solidification interface, disrupting the desired uniform directional or crystallographic nature of the solidification. On the other hand, if the solidification rate is too slow there is a likelihood of dendritic remelting and associated defects, mold interactions which degrade the alloy, and unduly long and uneconomic process times. The interrelationships between the aforementioned solidification parameters are extensively described in the paper "Computer Applications in Directional Solidification Processing" by Giamei and Erickson in the Proceedings of the Third International AIME Symposium on Superalloys, at Seven Springs, Pennsylvania, Sept. 19, 1976, pp 405–424; B. Kear, Ed., Claitor, Baton Rouge, La, 1977., which is hereby incorporated by reference.

Experience has shown that usually the conditions of optimum solidification are those where there is a maximum withdrawal rate without nucleation. These conditions establish the optimum economic situation. Consequently it is an objective of solidification process improvements to achieve these conditions in a casting. And when a mold has a constant cross-section and is in an apparatus generating a particular temperature gradient with a particular alloy, the maximum withdrawal rate can be established and achieved. However, most commercial products have instead varying cross-sections; a good example is a gas turbine airfoil which has a heavy root section, a thin and usually tapered airfoil section and often a heavier shroud at the airfoil tip. For such items the past practice has been to choose a fixed rate which will satisfactorily solidify the heavy and thin sections as the solidification interface passes through both of them. This of course requires some compromise in the optimization of the parameters mentioned above and results in a compromise in the structure which is achievable in the sections having different sizes. Also since the maximum rate is set by the heavier section from which the heat extraction is most difficult and where the thermal gradient is most difficult to make steep, the rate of production is accordingly limited.

Directional solidification can be used to make materials for any composition for any application, but it most particularly has recently been used to make three increasingly common but still quite advanced categories of materials for commercial gas turbine use: those which have columnar grain, single crystal or aligned eutectics. Many commercial superalloys such as U-700, B-1900, MARM-200 and IN-100 have been converted into columnar grain and single crystal form; other specialized ones have been developed for these unique structures, among them hafnium-modified MARM-200 and B-1900 and the alloys referenced in Example 3 herein. Eutectic alloys of commercial interest are typically multi-element alloys with very narrow temperature differentials between the liquidus and solidus (typically 5°–20° C.). They are often difficult to consistently solidify in a directional manner, because the parameter $\Delta T/D$ and consequently $(G/R)^*$ is high (on the order of 125° C.-hr/cm²), and even with high gradients, the maximum R is a relatively low speed (<1 in/hr) and easily exceeded without proper control.

With a given apparatus-produced thermal gradient, the effect of R on the microstructure of the foregoing types of alloys can be summarized as follows: for low values of R in nickel base alloys a planar microstructure will result; as it is increased a cellular and then a dendritic structure will result. With these changes improved tensile and creep properties may result. In eutectic alloys the trend is similar except that when very low growth rate values are encountered, a coarse lamellar or "trapezoidal" structure can be formed; as the values are increased the structure becomes finer, then cellular, then dendritic.

The need for carefully controlling the thermal conditions and directional solidification rate has been long recognized. For example, Kraft U.S. Pat. No. 3,124,452 of the present assignee, described methods for unidirectionally forming eutectic alloys with spaced lamellae by regulating the solidification rate and thermal gradient and controlling the ratio between them within a broad range of 0.1° to 1,000° C.-hour per square centimeter. The desirability of high thermal gradients and the higher solidification rates that may be associated therewith is taught by Tien et al U.S. Pat. No. 3,677,835, of the present assignee. Tien also teaches suppression of the mushy zone in front of the solidification interface in order to inhibit dendritic growth and provide cellular and plane front structures in nickel alloys, particularly high gamma prime alloys such as NX188. Low solidification rates of the order of 0.2 inches per hour are mentioned. Smashey U.S. Pat. No. 3,897,815 discloses the application of hot zone heat at a plurality of rates to control the molten state of the casting and the directionality of solidification when the mold is being withdrawn from the hot zone. Coordination of the withdrawal and heating is mentioned as the general relation G/R suggests.

It has occasionally been the practice to remain stationary or go slowly after the metal is first poured into the mold, to allow the metal to stabilize within the mold, and to achieve good initial grain or crystal growth from the chill plate or single crystal starter, as the case may be. While the interrelation and importance of the apparatus-effected parameters and the material-effected parameters on the final casting has been recognized, the production of complexly shaped casting parts has not heretofore been generally conducted with other than a compromise unitary withdrawal rate or possibly a single change in growth rate. This may be attributed to the path and state of development of directional solidification. Processes originated in the laboratory for simple constant-cross section samples where unitary rates are entirely appropriate. They were largely transferred in toto to the still-infant production and preproduction of complex shapes. Now, there is more economic incentive to optimize procedures. Also, the criticality of microstructure has become better recognized as designers become more adept at using the new materials near their limits, producing the need for more careful control of solidification. Another factor has been the use of different alloys which have much more sensitivity of properties-to-microstructure and microstructure-to-solidification rate, than the earlier alloys.

The manufacture of eutectic alloy turbine blades which have varied structures, e.g., aligned airfoil with equiaxed root, as in Endres et al U.S. Pat. No. 3,790,303, has been previously disclosed. The solidification conditions were varied, but only to the extent necessary to achieve these variant structures within the same part, and problems of correlating solidification conditions with section size changes apparently did not arise.

Finally, whatever limited recognition there may have been of the appropriateness of changing growth and withdrawal rates from one casting section to another, no prior record indicates recognition of a systematic way of choosing rates for one section with respect to another, nor of the need or manner of transitioning controllably between different rates.

SUMMARY OF THE INVENTION

An object of the invention is to improve directional solidification through use of different withdrawal rates in different sections of a casting and control of withdrawal rates. Further objects include producing directionally solidified articles which have: uniform microstructure despite varying perimeter to area ratios; transition sections with desirable properties, or; microstructures in different sections which are tailored to each section's mechanical performance requirements.

According to the invention, when a plurality of withdrawal rates are used to solidify a casting, transitioning between them is controlled. In one embodiment, the time rate of withdrawal is varied with the perimeter to area ratio along the length of the casting, to effect change in movement of the solidification interface which is in the same sense as the change in perimeter to area ratio. Cycles characterized as step, linear, convex, and S-shaped are used depending on casting perimeter to area ratios, solidification characteristics of the alloy, and apparatus-effected parameters. Articles having substantially uniform microstructure and articles having desired properties in different sections, both produced by the controlled withdrawal rate process, are also in accord with the invention.

The invention provides for the directional solidification of varied cross-section parts which have desired microstructure throughout and are free of defects which result from a compromise unitary withdrawal rate. Also produced are articles which have better structure and performance than those produced with withdrawal rate transitions which are not controlled to carefully predetermined relationships.

The invention increases consistency, and thereby minimum design levels, by reducing scatter in properties which are inevitable in any mass-produced engineering product. When casting parametrically sensitive alloys, the invention allows the rapid and economic production of articles which are free of defects such as spurious nucleation, microsegregation, porosity and unfavorable carbide structures.

The invention also permits solidification of aligned microstructure eutectic articles of complex shape which are 90% or more lamellar or fibrous in structure and with controlled spacings in the microstructure. Further, columnar grain articles which have a desired dendritic spacing and well-aligned grains in both large and small sections and, single crystal articles with desired dentritic spacing and minimal crystallographic orientation defects can be produced. And, desired microcompositions and superior performance in all the said articles can be attained.

The foregoing and other objects, features and advantages of the present invention will become more apparent in light of the following detailed description of preferred embodiments thereof as discussed and illustrated in the accompanying drawings.

DESCRIPTION OF THE PREFERRED EMBODIMENT

The preferred embodiment is described in the context of making a superalloy article such as a turbine blade using the withdrawal method with liquid metal cooling. It is also presumed that the hot zone and liquid metal cold zone are at fixed temperatures, meaning that the temperature gradient in the casting is constant. However, it should be understood that those skilled in the art will find it apparent that the invention is equally usable and pertinent to other types of withdrawal apparatuses, including those using varied temperature hot zones, radiant cooling, and different chill configurations. The invention is also, of course, applicable to all materials and shapes which might be processed by directional solidification.

Figure 1:
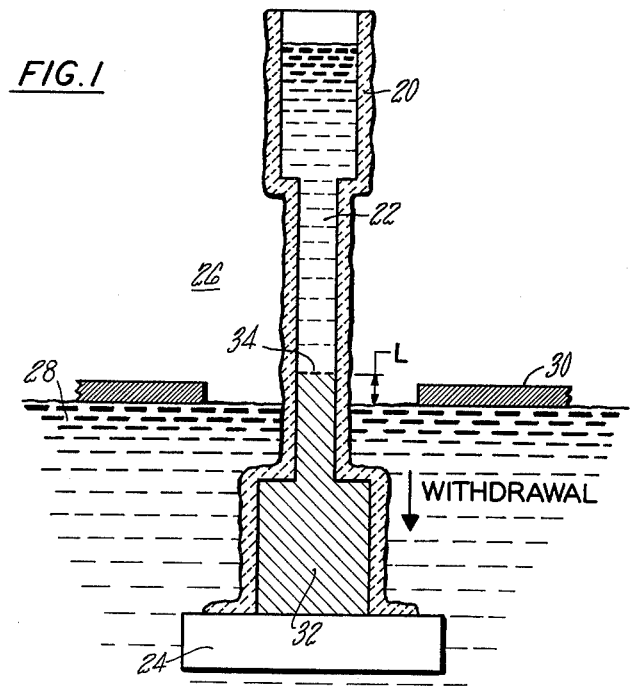
FIG. 1 is a vertical section of a partially directionally solidified casting as it appears when particlly withdrawn from the hot zone into a liquid metal cooling cold zone.

The general arrangement for solidifying an article using the withdrawal technique is shown in FIG. 1. A mold 20 filled with molten metal 22 is affixed to a chill plate 24. The mold which was originally fully in the hot zone 26 is gradually withdrawn into the cold zone 28 by movement of the chill plate. A baffle 30, often used, lessens heat transfer between the hot zone and cold zone. The molten metal 22 is converted into a solid article portion 32 due to the extraction of heat caused by the chill plate and the cold zone surrounding the mold 20. The point of demarcation between the solid portion 32 and the liquid metal 22 is the solidification interface 34. Under normal withdrawal conditions the solidification interface will be located in proximity to the baffle 30, that is, near the point of transition between the hot zone and cold zone. It is shown in FIG. 1 a distance "L" above the liquid metal cold zone top. However, if the withdrawal rate is excessive, the solidification interface will tend to move toward the colder zone and may also be shaped convex upward in severe cases, as mentioned previously. If the withdrawal rate is too slow, the solidification interface will be located towards the hot zone side of the baffle, i.e., L will increase, and may in addition be shaped convex downward. In the first case the heat transfer in the cold zone is insufficient to remove the specific and latent heat of the molten metal at a rate commensurate with withdrawal, while in the second case the cooling in the cold zone and through the central part of the solidified article is sufficient to push the interface along the article faster than the withdrawal rate until it reaches a point of steady state balance. Of course, changing the temperature and heat transfer to the hot zone portion or changing the withdrawal rate, would have similar effects on L, when the other parameters are held constant.

In this disclosure the nominal solidification interface is the average location of the solidus-liquidus isotherm in the solidifying casting. In most commercial alloys there is a significant temperature difference between the solidus and liquidus. Consequently, there is not a sharply defined interface between the solid and liquid, but instead there is a so-called "mushy" zone, the axial length of which varies with the alloy, the temperature gradient, withdrawal rate, etc. A true eutectic, of course, would have coincident liquidus and solidus and a definite solidification interface. Superalloy entectics typically have a 2°-8° C. spread inasmuch as they are imperfect eutectics. While the apparatus in FIG. 1 is described in terms of withdrawal it should be evident that in the general case all that is required is translation of the mold with respect to the hot and cold zones; therefore, it would be within the scope of the invention to translate the hot and cold zones with respect to a fixed mold and chill plate. It will be shown that there is a desirable interrelation between the withdrawal rate W and the solidification rate R. The solidification rate R, alternately called the growth rate, is the speed with which the solidification interface moves through the liquid metal.

Withdrawal Rates

Figure 2:
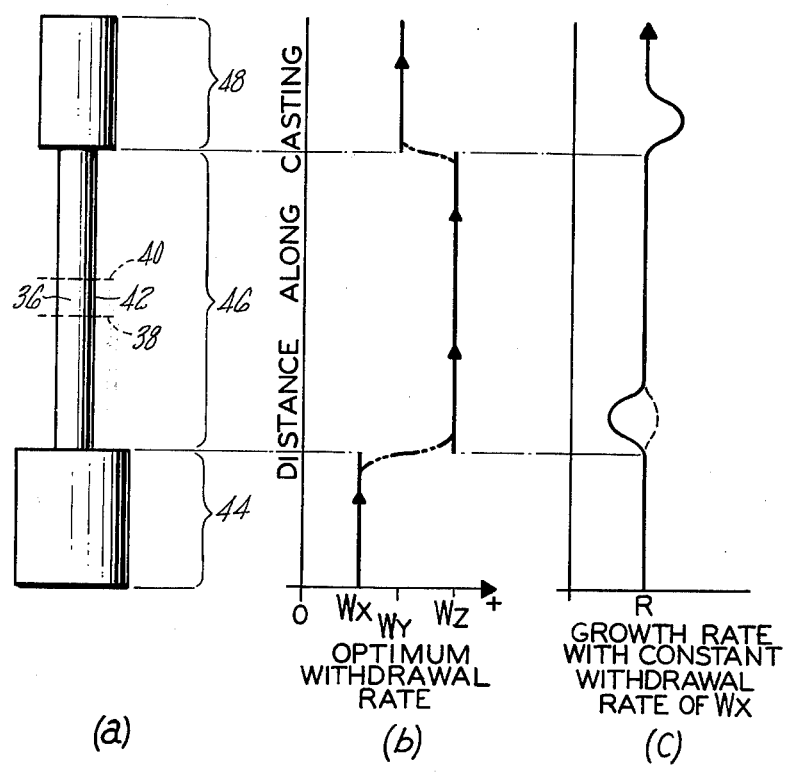
FIG. 2 is a typical casting with associated withdrawal and growth rates.

A cylindrical casting having different cross-sections along its length is shown in FIG. 2. A representative casting such as this will conveniently illustrate withdrawal rate analysis and its effects on growth (solidification) rate. With reference to FIG. 2(a) a subsection of metal 36, when molten, has heat of solidification proportionate to its volume. During the withdrawal process the incremental heat transfer from the section is dependent on the area of the cylindrical surface 42. Consequently, the ratio between the heat stored in a section and the heat transfered from a section can be characterized in terms of the ratio of the surface area to the volume. If now, the length of the section 36 is made very small by moving the planes of definition, 38 and 40, very close together until they define an extremely small unit length, the axial length unit can be factored out and the surface-to-volume area parameter becomes equalled by the ratio of the perimeter P to the cross-sectional area A, or P/A. The foregoing description applies to the very simple representative casting but is also applicable to complex castings.

In the case just described P was given as the perimeter of the casting itself. However, while P can be correlated with the casting surace dimension in the case of a part surrounded by a mold, the mold dimension must be taken into account. Referring back to FIG. 1 to illustrate this, P should be taken as a measure of the unit area influencing heat transfer from the solid casting 32 through the mold 20 into the cold zone 28. Accordingly P would be adjusted for any factor causing variation in heat transfer characteristics, such as changes in mold thickness, composition, surface roughness, and so forth along the axis of the casting. Typically, these adjustments are not required, as the mentioned factors are not variable. "A" is a functional measure of the stored heat in the casting and mold at a given point and would therefore be adjusted for any changing composition (and specific heat) within the cross-sectional area, such as would be caused by the presence of a solid ceramic core. As a practical matter, for most situations, the use of the Perimeter and Area of the metal casting is adequate, with some account for the core in the Area when present. For the casting shown in FIG. 2(a), going from bottom to top as it would be directionally solidified, it can be seen that P/A would first increase at section 46 and then decrease at section 48 to a value intermediate between that of sections 44 and 46.

FIG. 2(b) illustrates figuratively the relative optimum withdrawal rates W which might be associated with the sections along the length of the article in FIG. 2(a). It can be seen that the rates vary with the P/A of the section, or, with the reciprocal of the diameter for the simple cylindrical casting, since $P/A = 2\pi R/\pi r^2 = 2/r = 4/d$. An optimum withdrawal rate, as discussed in the background section, would be that maximum rate attainable while maintaining an essentially planar solidification interface, achieving the desired properties, and avoiding defects. For the example shown in FIG. 2(b) it is presumed that an optimum structure is desired through the article. Therefore, the withdrawal rate $W_x$ would be chosen to produce the desired microstructure in the first section 44; $W_z$, which is substantially higher, would be used for the higher P/A section 46, and an intermediate rate $W_y$ would be used for section 48.

The foregoing change based on P/A was indicative of a situation in which the maximum possible solidification and withdrawal rates were desired, and is a typical situation. However, in less frequent situations, it may be that dissimilar microstructures are desired in different sections in order to optimize mutually exclusive properties. In such an event the rate in a section would be further modified by a factor, e.g., a percentage of the maximum planar front solidification rate, in order to achieve the desired properties.

Under such circumstances the rate in a second section compared to a first section with be that resulting from two superposed factors: (1) the change in P/A of the second section compared to the first section, the rate change being in the same sense, and; (2) the change in microstructure compared to that which would result from the first-factor-dependent-rate, the rate change being in whatever sense and amount was necessary.

As has been pointed out, it has been the practice to solidify articles having varying cross-sections or P/A's at a unitary rate or a single step change. For the article shown in FIG. 2(a) the unitary rate which would be selected would be $W_x$ since any other rate would be too great for section 44 and would result in spurious nucleation in the first section. There are two consequences from this choice: the first is that suboptimum conditions are encountered in the second section 46 and third section 48, e.g., a convex downward solidification interface would result and production time of castings would be greater than might be achieved. The second consequence, illustrated by FIG. 2(c), is the solidification/growth rate R which would result from a constant withdrawal rate of $W_x$. For the first section 44 the growth rate is equal to the withdrawal rate $W_x$ and is optimum. This rate is also maintained in the bulk of the second and third sections. However, as shown in FIG. 2(c) there is a deviation at the transition between the first section 44 and the second section 46. The nature of the deviation is dependent upon the particular conditions of the alloy and apparatus, but the solid line illustrates an unusual-appearing but nonetheless typical phenomena wherein the solidification interface slows considerably. This is explicable by considering that the heat input to section 46, from the hot zone, relative to its heat loss, is dependent on the P/A ratio. It can be conceptually understood and is experimentally verified that since the P/A for section 46 is greater than that of section 44 the distance shown as L in FIG. 1, between the solidification interface and the boundary of the hot zone and cold zone, is decreased when W is constant. Given this, the solidification interface momentarily slows or stalls as the interface passes through the section change. In similar manner an opposite reaction occurs as the solidification interface passes from section 46 to section 48. The foregoing phenomena are observed in liquid metal cooling which is a process characterized by a very high thermal gradient. In other apparatus where the cooling effectiveness of the cold zone is less it is possible to get a different behavior of the solidification interface at the transition section as illustrated by the dashed line in FIG. 2(c). Regardless of the exact growth rate vs. time realtionship, it is generally true that when a section size change is encountered, a disruption in the growth rate will occur unless proper compensation is made. This has not heretofore been recognized by those skilled in the art. With a disruption in the growth rate the microstructure and properties of the casting will be altered, the degree being dependent upon the sensitivity of the alloy and the criticality of the application of the article.

The foregoing discussion should indicate that it is advantageous to change rates according to the P/A ratio of the sections of a casting, but that the change in rate must be done in a manner which avoids stalling or speeding of the solidification interface.

Transition Cycles

Figure 3:
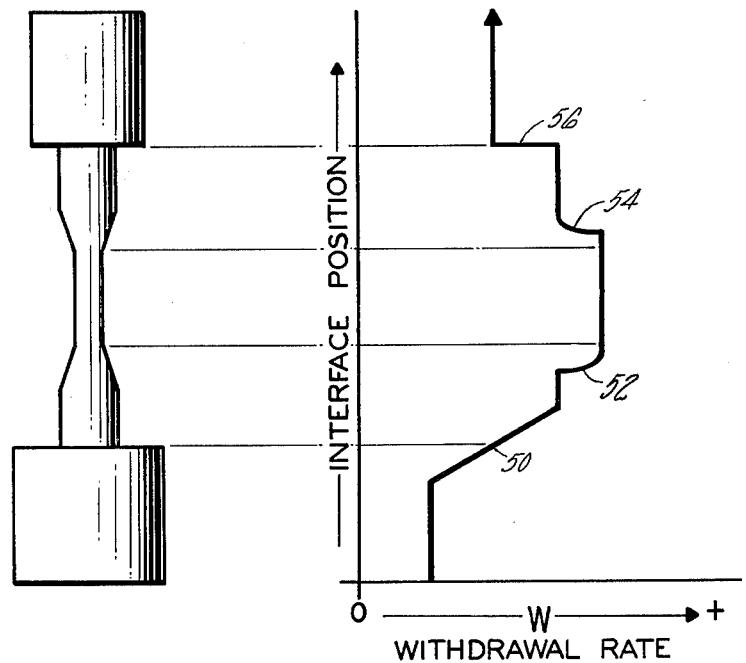
FIG. 3 is a casting with varied section sizes and a curve of withdrawal rate associated therewith.

FIG. 3 shows a cast article with a somewhat more complex shape and, adjacent to it, a graphical representation of the different withdrawal rates; these withdrawal rates are varied according to the direction of change of the P/A of each section. The proportion of change in W with P/A will be dependent on the particular apparatus and material parameters, and the type of microstructure desired, and will be determinable with experience with any particular system. Moreover, FIG. 3 illustrates different paths by which the rate may be varied as the solidification interface passes through each section size change. The change in withdrawal rate is seen to be linear with distance along the casting at the first section size change, as illustrated on the graph by the segment 50. The next two rate changes 52 and 54 are parabolic in form, while the last rate change 56 is a step. The paths of rate change in FIG. 3 are intended to be illustrative of variations and are not necessarily the optimum paths for the configuration shown, inasmuch as the optimum paths are dependent on the particular alloy, apparatus, and microstructure. Nonetheless, it should be appreciated that, based on the discussion of FIG. 2 there will be more subtle, but nonetheless significant, changes in growth rate with more complex changes in P/A. It also should be understood that the precise time of initiation and conduct of the rate change is variable and interdependent with the cycle. However, since the rate transition cycle is associated with the varying P/A of the transition section it is axiomatic that the transition cycle is conducted during a time when the solidification interface is in the vicinity of the section.

Figure 4:
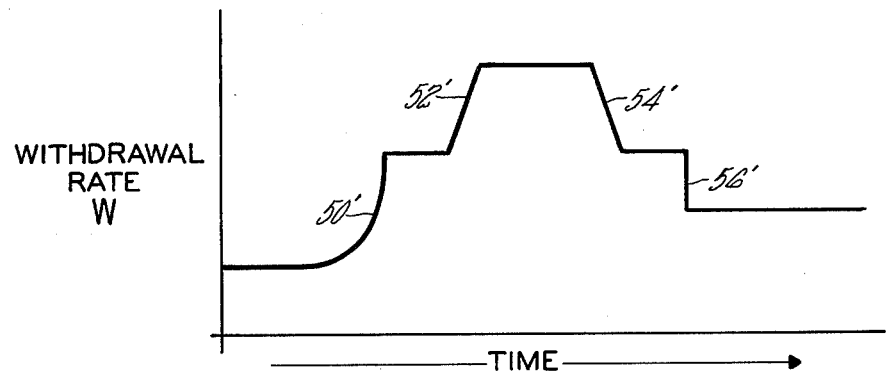
FIG. 4 is a withdrawal rate curve with respect to time, related to FIG. 3.

It might seem appropriate to the person newly approaching the problem that directly proportioning the withdrawal rate to the P/A ratio in a transition section would be satisfactory. But, experience thus far shows that such a simple solution is rarely forthcoming, in no small part because of the same factors which affect the relationship between withdrawal rates in one constant section compared to another constant section. Given this complex situation and the varieties of transition sections, it has been found by experiment that certain mathematically definable withdrawal rate changes are appropriate. To illustrate some of these, FIG. 4 should be considered. Shown in the Figure is a plot of the withdrawal rates shown in FIG. 3 but now shown as a function of time. The rate-changing parts of the curve, 50', 52', 54' and 56' are calculable by integration of those shown in FIG. 3. The mathematics of sample calculations are shown in Examples 1 and 2 herein. That is, when W is proportioned linearly with casting length, as at 50, W is an exponential function of time as at 50'; similarly when W is a particular simple parabolic function of distance as in 52, W is a linear function of time, as at 52'. Since the control of withdrawal rate can best be stated as a function of time the discussion hereafter will utilize this approach. Of course, the knowledgeable person recognizes that withdrawal position itself is a function of time, and therefore with the time-base approach one could readily revert to the analysis of withdrawal rate as a function of withdrawal distance.

Figure 5:
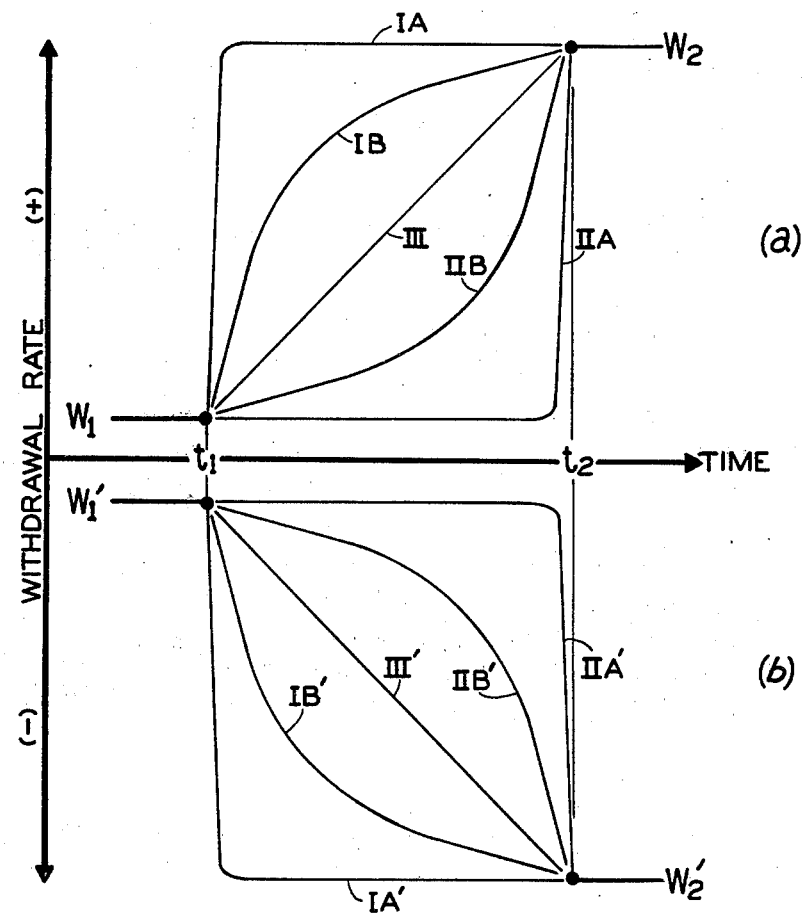
FIG. 5 is a graph of alternative withdrawal rate transition curves.

FIG. 5 shows, as plotted curves, the different paths or cycles by which the time rate of withdrawal can be changed, increasingly, or positively, in 5(a) and decreasingly, or negatively, 5(b). With reference specifically, FIG. 5(a) shows several paths by which the withdrawal rate can be increased from a first rate $W_1$ to a second rate $W_2$ during a time t between $t_1$ and $t_2$. These curves have been designated with respect to some general categories into which they can be classified. Curves of the designation IA and IIA are virtual step functions, that is, within the context of t the rate is virtually instantaneously changed from the $W_1$ to $W_2$. It should be appreciated that the step change could occur any time between $t_1$ and $t_2$ and that only the two limiting cases are shown. Mathematical expressions of Class IA and IIA curves are difficult to adequately characterize, but it is believed the designation "step function" is satisfactorily descriptive.

Curves of Classes IB and IIB are generally described herein as convex functions, Class IB is a type of rate change where relatively rapid initial change is followed by a more gradual change. Class IIB is, in the alternative, characterized by relatively slow change at first followed by a rapid change. Particular curves of Class IB and IIB can be described in terms of mathematical relationships of forms such as the following:

$$W = Ae^{nt} \text{ and } t = Be^{nW} \text{ and}$$

$$W = C - At^{-n}, \text{ and so forth}$$

where A, B, C and n are constants. Class III is a linear rate of change wherein the withdrawal rate is directly changed with time, i.e., acceleration of total amount of withdrawal is constant. This type of change can be expressed in terms of a mathematical relationship with the form $$W = At$$

where A is a constant.

There are other curves not shown which can represent transition cycles. Among these are S-shaped curves, which would be sequential combinations of Class IIB and Class IB curves, and reverse-S curves which would comprise Class IB, followed by Class IIB. Other combinations of the curves in the Figure could likewise be devised.

It is generally desirable to carry out the transition between a first rate and a second rate according to smooth curves such as shown in FIG. 5. However, control systems and means for creating a minimal change in withdrawal movement may be discrete or digitized, in that the real path of a rate change may be a series of steps, a succession of linear changes, an oscillatory path, or the like. Such irregular or imperfect transition cycles as just described, and complex combinations which either follow mean paths, or approximations similar to the smooth curves described herein, are within the scope and intent of the invention.

FIG. 5(b) is similar to FIG. 5(a) except that it represents a situation where the rate is decreased rather than increased. A study of the Figure will show that the curves labeled with prime designations matching those of the rate increase curve have analagous characteristics.

The curves shown in FIG. 5 represent those classes which have been useful for conducting rate changes in withdrawal as a solidifcaton interface passes through a change in section size of a casting over a period of time t between $t_1$ and $t_2$.

The common and distinguishing characteristics of the curves such as shown in FIG. 5 can be more definitely characterized by considering the first derivative of the curves. (In the following analysis it is of course inferred that at times $t_1$ and $t_2$ there will be a change in derivative to and from and to the value of zero which characterizes the constant rates $W_1$ and $W_2$.) Table 1 indicates the sign of the derivative for each Class of curve. Examination of the Table 1 shows that the primary distinction is that the first derivative for increasing rate is positive while that for decreasing rate is negative. But a further examination of the first derivative reveals differences in trend with time. These differences are indicated in Table 2 where it is seen that Class III curves have constant first derivatives while the other classes have variable values. As indicated in the Tables the derivative of the class IA and IIA step function is difficult to describe both succinctly and adequately.

TABLE 1

| Values of the First Derivative of Withdrawal Rate Curves Over Time t | | | |
|---|---|---|---|
| Increasing Rate | | Decreasing Rate | |
| Class | Value | Class | Value |
| IA | α | IA' | φ |
| IB | Positive | IB' | Negative |
| IIA | Ω | IIA' | λ |
| IIB | Positive | IIB' | Negative |
| III | Positive | III' | Negative |

Legend
α - infinitely positive for dt, then zero, where t is very small with respect to t.
Ω - zero then infinitely positive for dt.
φ - same as α but with reversed signs.
λ - same as Ω but with reversed signs.

TABLE 2

| Trend of Value of First Derivative of Withdrawal Rate Over Time t | | | |
|---|---|---|---|
| Increasing Rate | | Decreasing Rate | |
| Class | Value | Class | Value |
| IA | ψ | IA' | ψ' |
| IB | Less Positive | IB' | Less Negative |
| IIA | σ | IIA' | σ' |
| IIB | More Positive | IIB' | More Negative |

TABLE 2-continued

| Trend of Value of First Derivative of Withdrawal Rate Over Time t | | | |
|---|---|---|---|
| Increasing Rate | | Decreasing Rate | |
| Class | Value | Class | Value |
| III | Constant | III' | Constant |

Legend
ψ - positive, negative, then constant.
σ - constant, then positive, negative.
ψ' - same as ψ but with reversed signs.
σ' - same as σ but with reversed signs.

It is assumed that the step change takes place over a time dt which is very small with respect to t.

Finally, in Table 3 the trend of change in the absolute value of the first derivative is indicated. It can now be seen that the choice of absolute valuation eliminates the distinction between the case of increasing rate and the case of decreasing rate.

Some further observations may be made from the tables. Curves of the Class IB/IB' type which have a sharp initial change, followed by decreasing absolute values for rate of change and a smooth entry into $W_2$. Conversely, curves of the Class IIB/IIB' type have a smooth exit from $W_1$ and an increasing absolute rate value to $W_2$. S-shaped curves will have increasing and then decreasing or, decreasing and then increasing, rates of change (or slopes).

TABLE 3

| Trend of Change in Absolute Value of the First Derivative of Withdrawal Rate Curves Over Time t, Excluding the Time dt | | | |
|---|---|---|---|
| Increasing Rate | | Decreasing Rate | |
| Class | Value | Class | Value |
| IA | Zero | IA' | Zero |
| IB | Less Positive | IB' | Less Positive |
| IIA | Zero | IIA' | Zero |
| IIB | More Positive | IIB' | More Positive |
| III | Zero | III' | Zero |

Selection of Withdrawal Cycles

The manner in which a particular curve for transitioning from one rate to another is selected is as follows: Suppose a part has a larger first section with a low P/A and a smaller and thinner second section with a high P/A connected with the first by a small fillet; an illustrative part would be a gas turbine airfoil root with attached airfoil in which the low P/A section is to be solidified first. By running a transient heat transfer analysis of the type described by Giamei and Erickson in "Computer Applications in Directional Solidification Processing", supra, the interfacial position at any point during the withdrawal process under a particular withdrawal rate cycle can be calculated. This calculation can be verified by experimentally processing a part at a predetermined withdrawal rate and then sharply altering the hot zone temperature at a particular point in time, as by decreasing the input power to the hot zone, or otherwise disrupting solidification, thereby causing a defect in the casting in the proximity of the solidification interface. By also measuring the location of the mold at the point in time of purposeful defect, the basis is provided for determining where the solidification interface is with respect to the hot/cold zone demarcation. (In like manner, data can be accumulated for different P/A sections and withdrawal or growth rates with a given mold and alloy system for a complete empirical determination of the relationships, if the artisan chooses not to rely on the analytical modeling system.)

Based on prior experience, or separate experiment if necessary, the artisan knows the relationship between solidification growth rate and microstructure for the particular apparatus-produced thermal gradient, G. He also knows the relationship between microstructure and properties. So to produce the properties he desires in the particular sections of the casting he can determine the optimum growth rates. However, because of limitations on cooling and section size effects, i.e., the P/A ratio, less than the optimum growth rate may be attainable in a particular section. Therefore, the artisan will guite often seek to obtain the fastest growth rate possible while maintaining a planar interface, both because this often gives the best properties and because rapid rates give the highest production of castings for a given apparatus.

Accordingly, in the first instance, the withdrawal rate will be established directly at the desired growth rate value, since it is validly assumed that except in cases of transients and attendant after-effects, the growth rate will be very nearly equal to the causative withdrawal rate. Now a part will be processed according to the desired first section withdrawal rate, the microstructure will be inspected, and any adjustment made. Suppose for instance, an eutectic part were processed and found to exhibit a cellular structure in the first section. This would indicate that the ratio G/R was not greater than the necessary value, i.e., $(G/R)^* = \Delta t/D$. Since in this example it is assumed that G is fixed (being due to other parameters such as hot zone and cold zone heat transfer, baffle design, etc.,) the conclusion would be drawn that the withdrawal rate, and thereby the growth rate, should be slowed. The desired withdrawal rate is thus modified somewhat as necessary to compensate for any unaccounted-for variables in the particular first section configuration. Thereafter, a calculation can be made based on the ratios of the P/A values for the first and second sections, the second section rate determined, and experimentally verified or adjusted if necessary. Of course, if the microstructure in the second section were desired to be different than that produced by the fastest practical growth rate, to attain properties more appropriate to the second section demands, then the withdrawal rate would accordingly be decreased.

It is now known what the desired withdrawal rates are in each section but the question remains as to how to transition between the desired rates. According to the invention herein, this is to be done in a controlled manner according to a predetermined relationship. The manner of determining the relationship and the time of initiating the transition mode will now be explained. Assume hereafter that the first section has a desired first withdrawal rate, $W_1$; the second section has a second desired withdrawal rate $W_2$; the transition cycle is initiated at time $t_0$ and is completed during time t; and the rate change curve during the transition period is expressed as $W_t$.

(In this and the following instructive cases, in order to aid conceptual understanding of the choice of curve to use, the rates are implicitly described with respect to distance along the casting. The preferred method, as indicated above, is to state them as a function of the independent variable time, once a basis understanding of the concepts has been gained. The correlation between rates which are described as functions of distance and those described as functions of time has been mentioned, and is elaborated on in the examples. Reference hereafter to curve types is to W-t relations shown in FIG. 5.)

If, at first, in this instructive exercise, the rate desired for the first section was applied to the whole part, it would be found that the microstructure in the second section will be that which results from a too slow growth. Consequently, the problem is to increase the solidification interface speed (growth rate) so that it is up to speed in the second section, does not exceed the maximum in the first section, and furthermore, does not exceed the maximum nor produce undesirable properties in the transition section. The time for initiation of the growth rate transient is of course interdependent with the shape of the transient curve, particularly where the initial rate of transition is quite gradual, or where the growth rate in the first section is substantially below that which causes deviant properties with the particular alloy.

A step rate change might be first considered. It would seem that if the step rate change were coordinated with a step section size or P/A change in the casting, it would be appropriate. This is theoretically so, but practically it is extremely difficult to achieve the perfect timing needed. If the step is initiated too soon, the rate will be too fast for the first section and thereby could cause defective microstructure; if too late, the rate will be too slow for the second section and could cause related defects. Nonetheless, in cases where the criticality and sensitivity of microstructure are not great, the step change may be useful. It is also found that a step change is more often useful for rate decrease than rate increase. Expressed in terms of rate vs. time, step rate changes would have the general form of Class IA and IIA curves. (Inasmuch as the step change within the context of withdrawal rates encountered happens virtually instantaneously, or more accurately, over a dt which is very small with respect to t, it is immaterial whether the Class IA or IIA is used, since they can be made identical in effect by choice of $t_0$, the time when the cycle is initiated.)

If the step change were not suitable, the next step would be to try other smooth relationships, as follows:

a. Suppose it was determined that the rate in the first section was not such that the minimum G/R ratio was near being violated but that conditions in the second section were critical. This would suggest a rate change relationship of the type which would give rapid increase at first, while the interface was in the first section followed then by a decreasing increase to the final desired rate as it proceeded into the beginning of the second section. Expressed in terms of rate vs. time, this could suggest an exponential curve of the Class IB type, for example, having the forms $$W_t = A_n e^{nt}, \text{ or}$$

$$W_t = A_n t^n$$

where n is a negative number and A is a constant. This would indicate that the respective final rates would be $$W_2 = W_1 + A e^{nt} \text{ and } W_2 = W_1 + A_n t^n$$

b. Suppose it was determined that the rate in the second section was less critical to desired properties than that of the first section. This would suggest the use of a rate change curve where the interface would be gradually increased in speed and thereafter the rate of movement would be increasingly increased as the interface moved into the second section. Expressed in terms of rate vs. time, this could suggest exponential curves of the Class IIB type, having the same general formulae as in (a) immediately above, but with n being a positive number.

c. Suppose that in the case of (b) immediately above, it was found that there were defects in the end of the first section due to exceeding the maximum growth rate condition. This would suggest decreasing the initial rate of change, or for example, using an exponent n with a less positive value in the relation $W = t^n$.

d. Suppose that in the case of (a) immediately above, it was found that there were defects in the beginning of the second section due to going at too slow a rate. This would suggest either starting the transition cycle at an earlier time, or altering the rate vs. time relationship, as by using an exponent with a more negative value.

e. Suppose that the P/A ratio along the transition section were gradually decreasing in a progression, as in a gradual fillet of the illustrative turbine blade part mentioned above, and that all sections had criticality and sensitivity to microstructure. This could suggest trying a rate change curve where the rate was increased in a uniform progression with distance along the casting. Expressed in terms of rate vs. time this would be a linear function of the form $W_t = At$, and that shown as a Class III curve.

f. Suppose that in the case of (e) immediately above a defect was observed at the beginning of the transition due to going too fast: this would suggest extending the time over which the transition rate was conducted. Suppose, in the alternative, that a defect in the beginning of the transition section was due to going too slow: this would suggest initiating transition at an earlier time. Suppose, in the alternative, the defect due to going too slow was at the end of the transition section: this would suggest shortening the time over which the transition rate was conducted. It should also be evident that the aforementioned defects might be cured by changing to one of the other class curves.

g. Suppose that in a transition section defects were occurring due to too rapid changes in the first and second sections. This would suggest that an "S" shaped transition cycle curve would be appropriate, or a combination of the cycle suggested in (b) above followed by that of (a) above. In like manner, it should be evident that a "reverse-S" might be also appropriate under other circumstances, to produce a sound microstructure.

The foregoing cases are intended to be illustrative and not exhaustive of the method by which a skilled person would ascertain the appropriate relationship for the transition mode of shifting between a first rate and a second rate. It should be apparent that the cases above are presented in terms of a decreasing P/A; for the reverse case, the second rate would be decreased, and the transition rate change directions altered accordingly, as is exemplified by FIG. 5. It should be also noted that the definitions of the first, second, and transition sections are arbitrary and thus there is no limitation in the invention on the length of a second section or any exclusion on a second section itself being part of a greater transition section. The cycles which are described in terms of mathematical or continuous functions are approximations and a series of small step functions, small linear changes, or other small cycle changes which viewed as a whole would generally comprise a smooth continuous transition between one rate and another rate would fall within the scope of the invention.

Certain transition cycles between the first rate and the second rate are not believed to be useful at the present time: They are cycles in which the withdrawal rate significantly exceeds either the first rate or the second rate, and; those in which there is a major trend of rate change is in accord with the direction of P/A change, but the cycle is such that within the major trend there are significant reversals in the direction of the rate change, e.g., a sinusoidal wave along a linear path. Mathematically stated, the cycles believed to be non-useful are such that the first derivative changes sign, passing through zero. This should not be meant to exclude transition cycles where, as a matter of inertia of the system, there is a small deviation beyond the limits; cycles in which the withdrawal rate momentarily deviates, but not to such a degree to cause the growth rate to follow in like fashion, and; circumstances under which there is "hunting" or other oscillation of a benign natural attributable to the control or withdrawal system.

The following examples are additionally illustrative of the invention and its practice:

EXAMPLE 1

It is desired to convert a growth rate which is to be varied linearly with the interface position to the equivalent relationship which is a function of time. The axial distance along the casting is z. The rate is to be changed during a time t from $R_1$ to $R_2$ over a height H with a slope S defined by:

$$S = \frac{dR}{dz} = \frac{R_2 - R_1}{H} \tag{1}$$

During the transition the instantaneous growth rate is given by:

$$R = \frac{dz}{dt} = S(z - z_o) + R_1 \tag{2}$$

where $z_0$ corresponds to the initiation point for the transient. Separating variables, we have:

$$\frac{dz}{S(z - z_o) + R_1} = dt \tag{3}$$

Performing the required integration and applying the boundary condition $z(t_0) = z_0$ and the initial condition $t_0 = 0$:

$$\int_{z_o}^{z} \frac{dz}{S(z - z_o) + R_1} = \int_{0}^{t} dt = t \tag{4}$$

Rearranging the left had side:

$$\int_{z_o}^{z} \frac{dz}{(R_1 - Sz_o) + Sz} \left[ = \frac{1}{S} \log \left( (R_1 - Sz_o) + Sz \right) \right]_{z_o}^{z} \tag{5}$$

We are left with:

$$R_1 - Sz_0 + Sz = R_1 e^{St} \tag{6}$$

Solving for z:

$$z = z_0 + R_1(e^{St} - 1)/S \tag{7}$$

Differentiating:

$$dz/dt = R_1 e^{St} \tag{8}$$

Expanding:

$$R = R_1 \exp\left\{ \left( \frac{R_2 - R_1}{H} \right) t \right\} \tag{9}$$

Thus it is seen that the growth rate which is linear with axial distance is alternately defined as a growth rate which is exponential with time.

EXAMPLE 2

It is desired to convert a growth rate which is changed in linear fashion with time into the equivalent relationship where growth rate is a function of distance. In this case, axial distance is z, the rate of change in rate of growth is designated as the acceleration, a, and is constant, and the growth rate R is defined as:

$$\frac{dz}{dt} = R = R_1 + a(t - t_o) \tag{10}$$

Applying the specific initial condition $t_0 = 0$:

$$R = R_1 + at \tag{11}$$

The acceleration is defined by:

$$a = \frac{R_2 - R_1}{\Delta t} \tag{12}$$

Where $\Delta t$ is the transient duration. The position can be obtained by integration:

$$\int_{z_o}^{z} dz = R_1 \int_{0}^{t} dt + a \int_{0}^{t} t dt \tag{13}$$

Now we have:

$$z - z_0 = \tfrac{1}{2}at^2 + R_1 t \tag{14}$$

Thus it can be seen that t is proportional to $(z)^{\frac{1}{2}}$ and therefore R is also proportionate to $(z)^{\frac{1}{2}}$, or alternatively stated, R is a exponential function of z.

EXAMPLE 3

Figure 6:
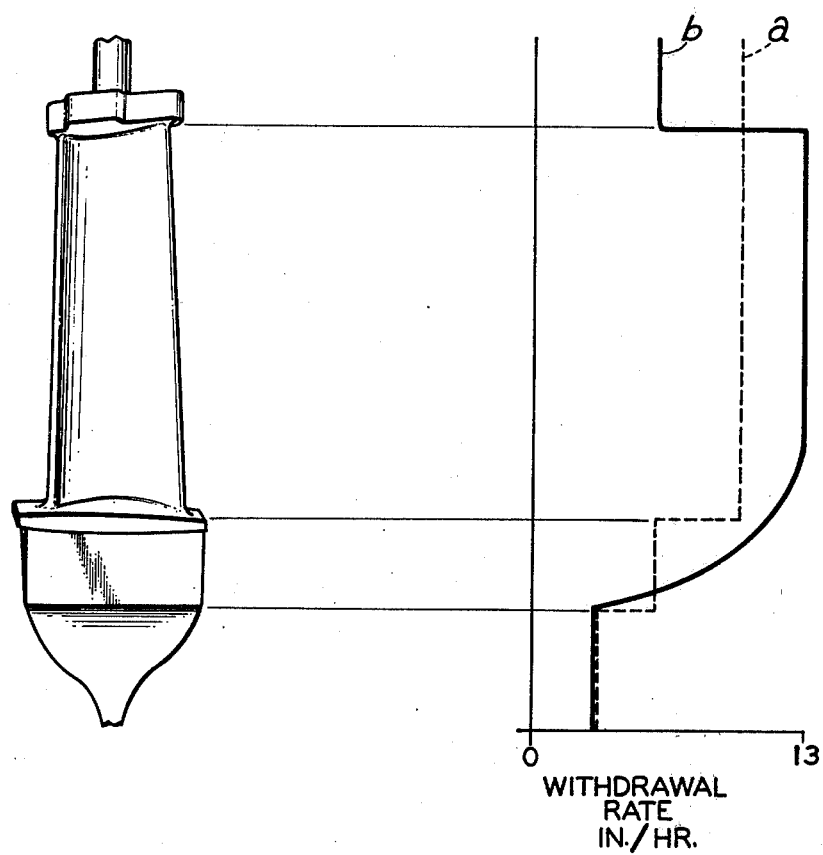
FIG. 6 is a gas turbine blade with associated withdrawal rate curves.

Using high rate directional solidification with radiation cooling, a Pratt & Whitney Aircraft JT8D-209 gas turbine first stage single crystal blade was made. The nominal P/A values along the section in inches$^{-1}$ were 4 for the root, 18 for the airfoil, and 2 for the upper shroud. The alloy was similar to that described in Gell et al, U.S. Pat. No. 4,116,723. The withdrawal rate in inches per hour was 3 for the single crystal starter and attendant tapered transition section, 6 for the root, and 10 for the airfoil and outer shroud. The blade configuration is shown in FIG. 6, together with the withdrawal cycle which is labeled "a". The resultant blade had a sound structure but crystallographic defects in the shroud region caused by spurious nucleation; this was attributable to excessive withdrawal rate in the shroud. Crystal structure in the root-airfoil transition was also somewhat imperfect. Total solidification time was 92 minutes.

EXAMPLE 4

The same blade and alloy were processed as in Example 3. The withdrawal rate in inches per hour was 3 for the starter and transition, increasing linearly with time to 13 in the airfoil, stepped down to 6 for the shroud. The cycle, labeled "b" in FIG. 6, is, of course, parabolic with distance. The blade had better crystal structure in the root-airfoil region and no nucleation defects in the shroud. Solidification time was 89 minutes.

EXAMPLE 5

A gamma-gamma prime plus delta eutectic alloy having the composition by weight Ni-2.5Al-20Nb-6Cr was formed into a shroudless turbine blade with a lamellar structure. The airfoil was a first stage turbine blade for a Pratt & Whitney Aircraft TW400-WV-402 gas turbine. The blade casting was about 1.5 inches overall in height and the 1 inch long airfoil and the root were about 1 inch in width. The fillet at the base of the airfoil where it attaches to the root top (platform) had a radius of about 0.1 inch. There was a 0.6 inch long constant cross section upper starter block attached to the base of the root. The nominal P/A in inches$^{-1}$ in the starter and root region was 7 while that in the airfoil near the root was 30 and that in the airfoil near the tip approaches was 80. Withdrawal with liquid metal cooling was used. The hot zone was heated to 2950°-3000° F. while the cold zone was liquid tin at 500° F. The mold was an alumina-silica investment type. The chill plate was a molybdenum block. A floating baffle was used. Experimental mesurements on castings approximating the P/A of the root revealed that thermal gradients, G, of at least 700° F./inch and up to 900° F./inch were achieved. A growth rate of 0.25 inches per hour was calculated to give a good microstructure in the root based on prior experience with the alloy and the casting was made using a withdrawal rate of that value. Examination of the microstructure revealed that the structure was fully lamellar, but that the lamellar spacing in the airfoil was excessive and indicative of lowered creep properties. It was concluded that the solidification speed in the airfoil was inadequate.

EXAMPLE 6

The same conditions are extant as in Example 3, except that the withdrawal rate is 0.65 inches per hour. The microstructure in the root in cellular rather than lamellar and indicative of lowered creep shear properties. It is concluded that the solidification rate in the root is too fast, that the critical G/R ratio has been exceeded. The microstructure in the airfoil is fine (closely spaced) lamellar and indicative of good properties. It is concluded that the solidification rate in the airfoil is suitable for the desired properties.

EXAMPLE 7

The same part and alloy described in Examples 5 and 6 are processed. Fully lamellar blades, both root and airfoil sections as well as the root-to-airfoil fillet radius were necessary to achieve the mechanical properties required for engine suitable blades. The initial casting trails were conducted utilizing withdrawal rates of 0.65 in/hr in the airfoil and 0.25 in/hr in the root. One step incremental rate changes were accomplished when the solid/liquid interface was located above, below, and at the root-to-airfoil transition region. Metallurgical evaluation revealed the expected planar front growth in the root and airfoil sections of the blade; however, extensive cellular regions and gamma microstructural bands were evident in the root-to-airfoil transition region. Casting trails which delayed the rate changeover to shift it further up into the airfoil, thereby preventing the occurrence of the cellular region at the top of the root, still revealed the cellular banded structure. In addition, gamma bands were observed in the lower airfoil vicinity. The presence of cellular microstructure in the upper section of the blade root indicated that despite the rate changeover being accomplished in the airfoil region, the rate of 0.25 in/hr in the upper root region was marginal since (G/R)* conditions were not met. Analytical heat transfer analysis can account for the microstructural degradation in the upper root in that it shows that the substantial increase in P/A ratio immediately above the root would reduce the thermal gradient in the upper portion of the root attachment and thereby lower G/R. Therefore to ensure lamellar microstructure throughout the root section of the blade, a dual-rate casting trial would be required with a lower initial rate. An experiment was conducted utilizing a 0.19 in/hr withdrawal rate and employing a one step rate change from 0.19 in/hr to 0.65 in/hr. The purpose of the trial was to evaluate the effect of the 0.19 in/hr rate on the upper root microstructure and establish the position of the solid/liquid interface at a given time in the solidification cycle. Microexamination of the blades from this trial revealed that a fully lamellar microstructure was achieved in the upper root section of the blade immediately below the airfoil. Some cellularity was still evident in the root platform region of the blade, as expected. An extensive cellular band in the lower airfoil approximately 0.22 inch above the roof platform located the rate changeover. The severity of the cellular band indicated a drastic deviation from plane front growth at the rate changeover and further substantiated the need for refinement of the rate change techniques.

It was evident that the transition between 0.19 and 0.65 in/hr could not be effective using the step change function. Before proceeding further, additional trials using 0.22 in/hr in the root were run, and while some decrease in banding was observed there was still evident a need for an improved transition. Thus, a transition cycle of the type shown as Class IIB in FIG. 5 was used; it was defined in part by the points listed in Table 4, over the range 0.22 to 0.55 in/hr, continuing in like fashion beyond these limits.

TABLE IV

Representative Class IIB Exponential Curve of Withdrawal Rate as a Function of Time

| Time (minutes) | Withdrawal Rate (0.01 in/hr) |
|---|---|
| 0 | 22 |
| 5 | 23 |
| 10 | 25 |
| 15 | 27 |
| 25 | 31 |
| 31 | 34 |
| 36 | 37 |
| 41 | 40 |
| 46 | 42 |
| 51 | 46 |

TABLE IV-continued

Representative Class IIB Exponential Curve
of Withdrawal Rate as a Function of Time

| Time (minutes) | Withdrawal Rate (0.01 in/hr) |
|---|---|
| 56 | 49 |
| 61 | 53 |
| 64 | 55 |

This type of transient was utilized in a series of casting trials which employed withdrawal rates of 0.19 in/hr in the root and 0.65 in/hr in the airfoil. The start of the rate transients were varied between 0.03 inches below the root platform to 0.13 inches above the root platform in an attempt to establish the optimum location of the solid/liquid interface during the implementation of the rate transient. Microstructural evaluation of these trials revealed that starting the rate transient below the root platform resulted in a cellular band in the upper portion of the root and root fillet radius, indicating a premature transient start point. On the other hand, when the rate transient was delayed to start at or above the root platform to ensure root and fillet microstructural integrity, a unique microstructural deviation not previously observed was caused. Based on its appearance it was termed "trapezoidal". The trapezoidal structure was confined primarily to the lower airfoil and was associated with extremely slow growth rates. The lower airfoil growth rates approached a "stall" condition as evidenced by the numerous delta bands in the vicinity of the trapezoidal microstructure. The thin trailing edge section having higher local "P/A" had the most pronounced defects.

The presence of the extensive trapezoidal microstructure throughout the lower airfoil suggests the existence of a minimum withdrawal rate for the alloy, which must be exceeded to prevent near stall conditions and the trapezoidal microstructure. Interlamellar spacing measurements coupled with additional experiments confirmed that the trapezoidal structure was associated with extremely slow movement of the solidification interface. Therefore, it was concluded that the movement of the interface had nearly stalled in the transition region. This was attributed to the section size (P/A) change. This P/A change corresponds to a sudden localized decrease in the solidification rate that results from a relocation of the solidification interface as it translates from a region of low P/A ratio in the root to a region of high P/A ratio in the airfoil. This was understandable in light of published heat transfer studies which show the solidification interface is located further into the cold zone in high P/A sections that it is in low P/A studies. Thus, it was evident the growth rate increase stimulated by the increasing withdrawal rate was insufficient to counteract the P/A effect, and a different transient with a higher rate of change of withdrawal rate were needed.

Two modifications were simultaneously pursued to achieve the required solidification conditions. First, the root section of the blade wax pattern was thinned-down by reducing the machining allowance to increase P/A. Second, the withdrawal rate transient was changed to one which was linear with time, or of the Class III type in FIG. 5. Casting trials were conducted using linear rate transients over different distances/times. Metallurgical evaluation revealed an incremental rate change of 0.008 in/hr/min over a 0.32 inch distance eliminated any significant microstructural banding. Although the start-point location (precisely at the top of the platform) produced acceptable lamellar roots and fillet radii, slight trapezoidal microstructure was evident at the very base of the airfoil. Evaluation of a 0.22 in/hr withdrawal rate and a transient start point which corresponded to a solidification interface position of 0.060 inch below the top of the platform did not reveal any evidence of trapezoidal microstructure. The slight cellularity evident in the vicinity of the low stressed root platform was considered acceptable. Further microexamination of the airfoil revealed an unacceptable cellular band approximately 0.23 inch above the top of the platform, corresponding to the upper portion of the acceleration of withdrawal. This was attributed to a localized growth rate increase, associated with the matchup of the P/A ratio and the acceleration transient. Therefore, the transition cycle was further modified by changing the withdrawal rate chamber to 0.003 in/hr/min after the withdrawal rate reached a value of 0.5 in/hr, which for the blade also was the time when the solidification interface was about 0.19 inch above the root platform.

Using the last mentioned cycle, adequate parts having but a small amount of cellularity at sections away from the root-airfoil transition, were thereby made. It should be evident that the last change placed the transition rate curve within the Class IB type in FIG. 5 and that although it was not expedient to further experiment within the exemplary case herein smoother curves of the Class IB type may have been even more appropriate.

EXAMPLE 8

For the blade in Example 4, which has a configuration much like that shown in FIG. 6, it is desired to evaluate different rate change curves to achieve good microstructure in root-airfoil transition section when a somewhat different sensitivity alloy is used. The first rate $W_1$ for the base is 3 in/hr and the second rate $W_2$ for the airfoil is 10 in/hr. An exponential curve having an increasingly positive first derivative is selected. The transition cycle has the equation $W = Ae^{nt}$ where $A = 3$ in/hr and $n = 0.17$ per minute. The transition is initiated at a time when the interface is in the vicinity of 0.375 inch of the root platform, and is completed in seven minutes over a 0.75 inch length of the casting. A sound part is produced.

Although this invention has been shown and described with respect to a preferred embodiment thereof, it should be understood by those skilled in the art that various changes and omissions in the form and detail thereof may be made therein without departing from the spirit and scope of the invention.

Having thus described a typical embodiment of my invention, that which I claim as new and desire to secure by Letters Patent of the Unitied States is:

1. In the withdrawal method of directional solidification of a metal casting which is characterized by differing perimeter to area ratios along its length,
   a. maintaining a hot zone at a temperature above the liquidus temperature of the metal of the casting;
   b. maintaining a cold zone at a temperature below the solidus temperature of the metal of the casting;
   c. withdrawing the casting progressively from the hot zone to the cold zone to effect movement of a nominal solidification interface, which is located between the liquidus isotherm and the solidus isotherm, at a rate which directionally solidifies at least a substantial portion of the casting;

d. effecting movement of the solidification interface through another portion of the casting by withdrawing the casting progressively from the hot zone to the cold zone, at a rate different from that in (c), and;

e. controllably transitioning between the different withdrawal rates according to a closely followed predetermined relationship between rate and time which represents at least one smooth function of withdrawal rate with time, as compared to a step function.

2. In the withdrawal method of directional solidification of a metal casting which is characterized by differing perimeter to area ratios along its length, a. maintaining a hot zone at a temperature above the liquidus temperature of the metal of the casting;

b. maintaining a cold zone at a temperature below the solidus temperature of the metal in the casting;

c. withdrawing the casting progressively from the hot zone to the cold zone to effect the movement through the casting of a nominal solidification interface, which is located between the liquidus isotherm and the solidus isotherm, and;

d. varying the time rate of withdrawal as a function of the change in casting perimeter to area ratio located along the casting length when the nominal solidification interface is in the vicinity of said change, so that the rate of solidification interface movement changes in the same sense as the perimeter to area ratio.

3. In the withdrawal method of directional solidification of a metal casting which is characterized by sections having differing perimeter to area ratios along its length, a. maintaining a hot zone at a temperature above the liquidus temperature of the metal of the casting;

b. maintaining a cold zone at a temperature below the solidus temperature of the metal in the casting;

c. causing the casting to move progressively from the hot zone to the cold zone to effect the movement through the metal casting of a nominal solidification interface, which is located midway between the liquidus isotherm and the solidus isotherm, and;

d. varying the time rate of withdrawal as a function of the change in perimeter to area ratio of the casting located along the casting length when the nominal solidification interface is in the vicinity of said change, to cause solidification interface to move at a rate or rates which produces desired microstructure and desired properties through a length of the casting having differing perimeter to area ratios.

4. The method in claim 2 where the rate of withdrawal is varied to produce the desired microstructure after heat treatment.

5. The methods in claims 2 or 3 where the desired microstructure is substantially uniform throughout the length of the casting having differing perimeter to area ratios.

6. The method in claim 3 where the metal casting is a single crystal superalloy and the desired microstructure is determined by measurement of crystallographic orientation, dendritic spacing and microcomposition.

7. The method in claim 3 where the metal casting is an eutectic superalloy and where the desired microstructure is determined by measurement of the degree of aligned composite structure, lamellar or fibrous spacing, and microcomposition.

8. The method in claim 4 where the metal casting is a columnar grain superalloy and the desired microstructure is determined by measurement of grain size, dendritic spacing, and microcomposition.

9. In the withdrawal method of directional solidification of a metal casting which is characterized by a first section, a second section having a different perimeter to area ratio than the first section, and a transition section connecting the first and second sections, a. maintaining a hot zone at a temperature above the liquidus temperature of the metal of the casting;

b. maintaining a cold zone at a temperature below the solidus temperature of the metal in the casting;

c. withdrawing the casting progressively from the hot zone to the cold zone to effect the movement through the casting of a nominal solidification interface which is located midway between the liquidus isotherm and the solidus isotherm;

d. as the solidification interface moves through the casting, maintaining a first time rate of withdrawal ($W_1$) for the first section and a second time rate withdrawal ($W_2$) for the second section, where sense of change in the rates of withdrawal is the same as sense of change between the perimeter to area ratios of the first and second sections, and;

e. controllably transitioning from $W_1$ to $W_2$ according to a predetermined relationship between rate and time, over a time (t) during which the solidification interface is in proximity to the transition section.

10. The method of claim 9 wherein the withdrawal rates, $W_1$ and $W_2$, and the controlled transition rate are those which produce a uniform microstructure in the first, second, and transition sections.

11. The method of claim 9 where $W_2$ is greater than $W_1$ and the first derivative of the predetermined relationship with respect to time is positive, except when zero.

12. The method of claim 9 where $W_2$ is less than $W_1$ and the first derivative of the predetermined relationship with respect to time is negative, except when zero.

13. The method of claim 9 where the predetermined relationship between rate and time is approximately that described by a convex function.

14. The method of claim 9 where the predetermined relationship between rate and time is approximately that described by $W=At$, where A is a constant.

15. The method of claim 9 where the predetermined relationship between rate and time approximates one or more step functions.

16. The method of claim 9 where the predetermined relationship between rate and time approximates a mathematical function such that the absolute value of its first derivative is decreasing during time t.

17. The method of claim 9 where the predetermined relationship between rate and time approximates a mathematical function such that the absolute value of its first derivative is increasing during time t.

* * * * *